US010985532B2

(12) United States Patent
Hokama et al.

(10) Patent No.: US 10,985,532 B2
(45) Date of Patent: Apr. 20, 2021

(54) SEMICONDUCTOR OPTICAL WAVEGUIDE AND OPTICAL INTEGRATED ELEMENT

(71) Applicant: Mitsubishi Electric Corporation, Chiyoda-ku (JP)

(72) Inventors: Yohei Hokama, Tokyo (JP); Koichi Akiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 163 days.

(21) Appl. No.: 16/328,579

(22) PCT Filed: Sep. 13, 2017

(86) PCT No.: PCT/JP2017/033042
§ 371 (c)(1),
(2) Date: Feb. 26, 2019

(87) PCT Pub. No.: WO2018/079112
PCT Pub. Date: May 3, 2018

(65) Prior Publication Data
US 2020/0274329 A1      Aug. 27, 2020

(30) Foreign Application Priority Data
Oct. 27, 2016   (JP) .............................. JP2016-210277

(51) Int. Cl.
*H01S 5/22*       (2006.01)
*H01S 5/026*      (2006.01)
(52) U.S. Cl.
CPC ................ *H01S 5/22* (2013.01); *H01S 5/026* (2013.01)

(58) Field of Classification Search
CPC .......... H01S 5/026; H01S 5/0265; H01S 5/22; H01S 5/20; H01S 5/2018
See application file for complete search history.

(56) References Cited

U.S. PATENT DOCUMENTS

| 5,687,272 A | 11/1997 | Vinchant et al. |
| 5,737,474 A | 4/1998 | Aoki et al. |
| 9,235,002 B2 | 1/2016 | Katsuyama |

FOREIGN PATENT DOCUMENTS

| JP | 7-174931 A | 7/1995 |
| JP | 8-78792 A | 3/1996 |
| JP | 8-116124 | 5/1996 |
| JP | 8-248248 A | 9/1996 |

(Continued)

OTHER PUBLICATIONS

International Search Report dated Nov. 21, 2017 in PCT/JP2017/033042 filed Sep. 13, 2017.

*Primary Examiner* — Armando Rodriguez
(74) *Attorney, Agent, or Firm* — Xsensus LLP

(57) ABSTRACT

The object is to provide a technology capable of efficiently injecting a current into a core layer of a buried waveguide. On one end side of the substrate, a buried waveguide including a core layer, a cladding layer, and a current blocking layer is disposed, both sides of the core layer in a layer-stacking direction are sandwiched by the cladding layer, and both sides of the core layer in a width direction that is perpendicular to the layer-stacking direction are sandwiched by the current blocking layer. On another end side of the substrate, a ridge waveguide including the core layer and the cladding layer is disposed, and both sides of the core layer in the layer-stacking direction are sandwiched by the cladding layer.

12 Claims, 20 Drawing Sheets

(56) References Cited

FOREIGN PATENT DOCUMENTS

| | | |
|---|---|---|
| JP | 2000-114671 A | 4/2000 |
| JP | 2001-42149 A | 2/2001 |
| JP | 2012-235069 A | 11/2012 |
| JP | 2013-110274 A | 6/2013 |

F I G . 5
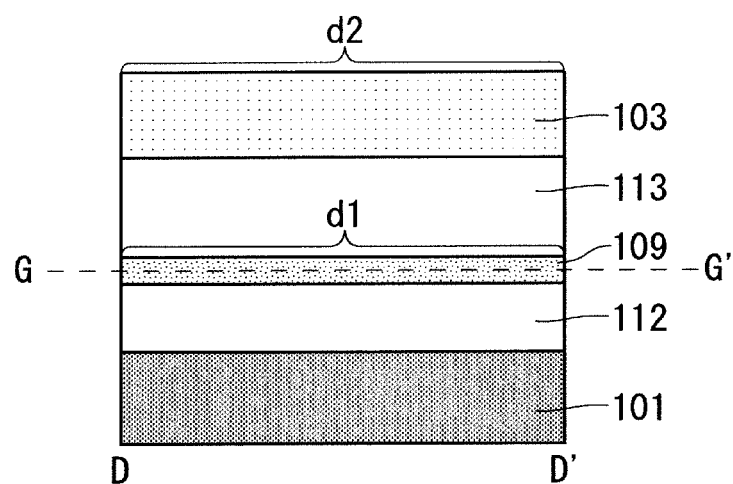
F I G . 6
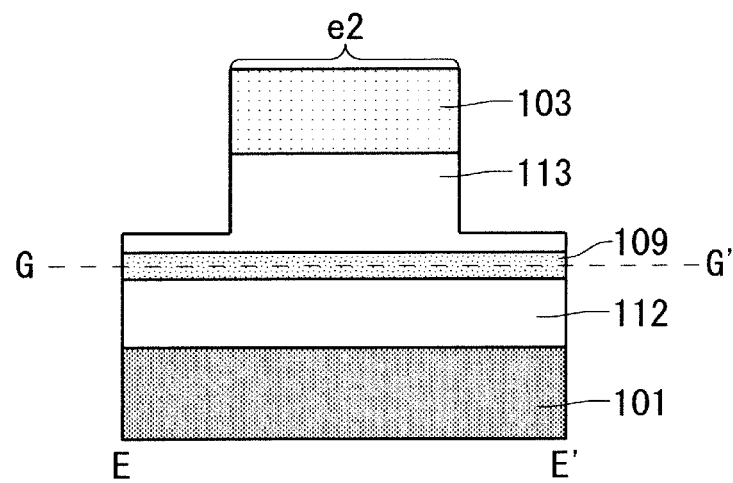

F I G . 7
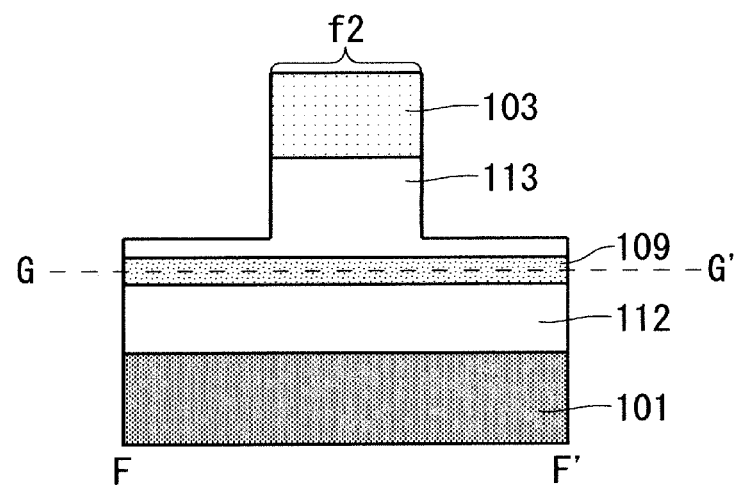
F I G . 8
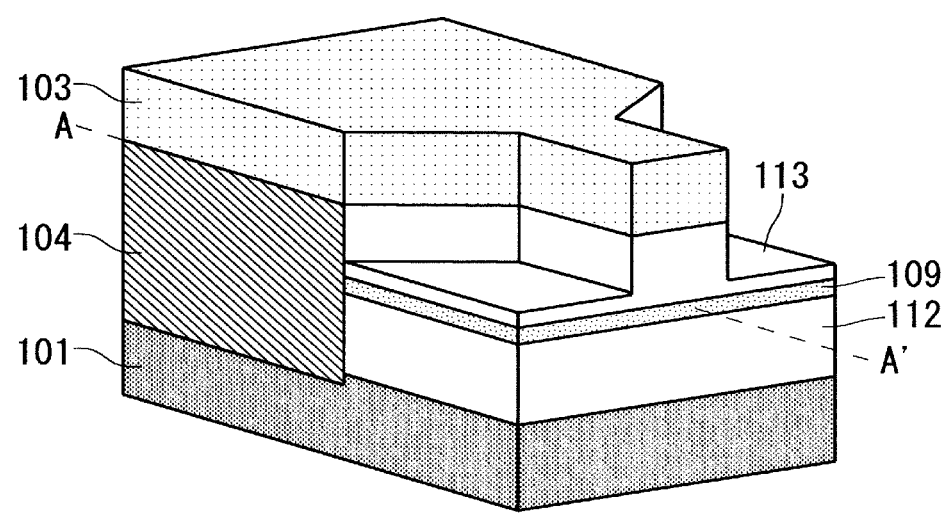

F I G . 9
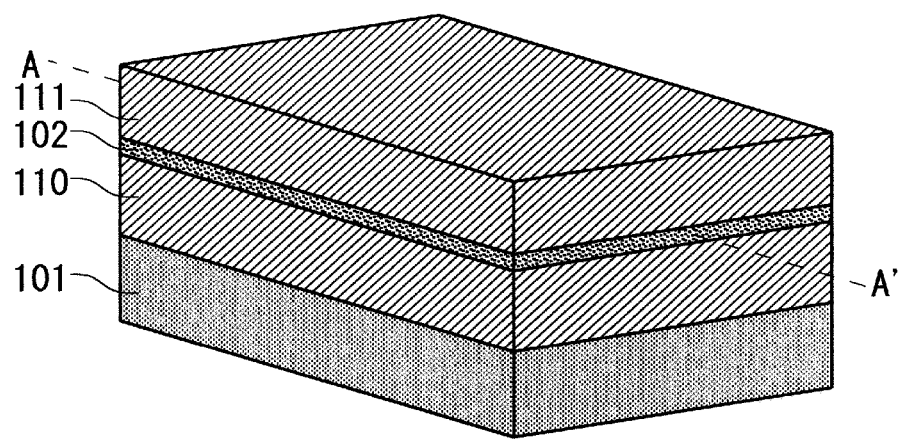
F I G . 1 0
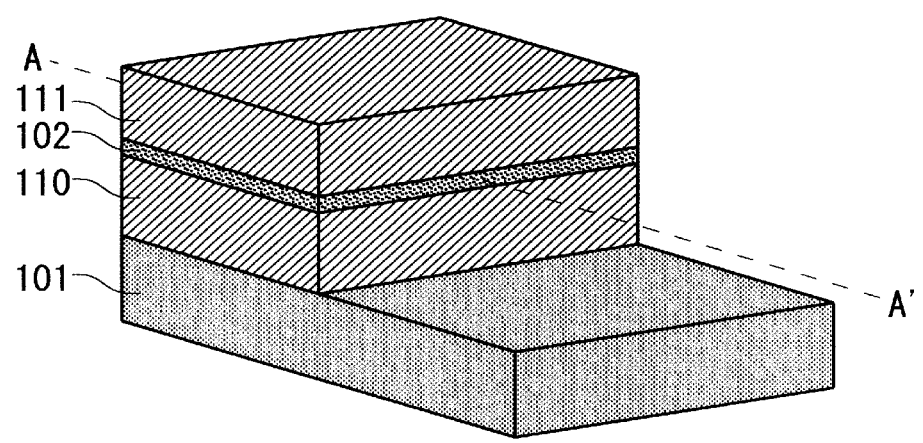

F I G . 3 1
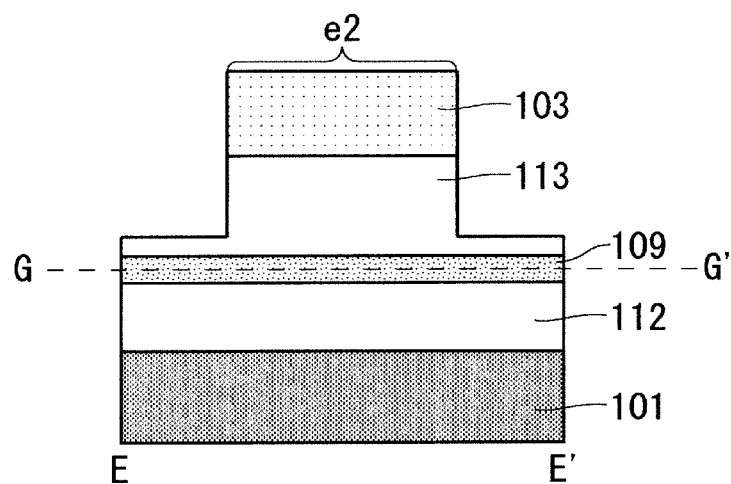
F I G . 3 2
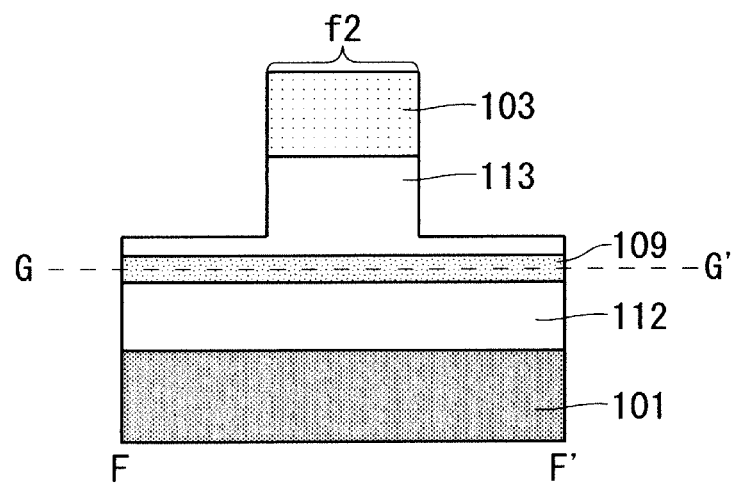

F I G . 3 3
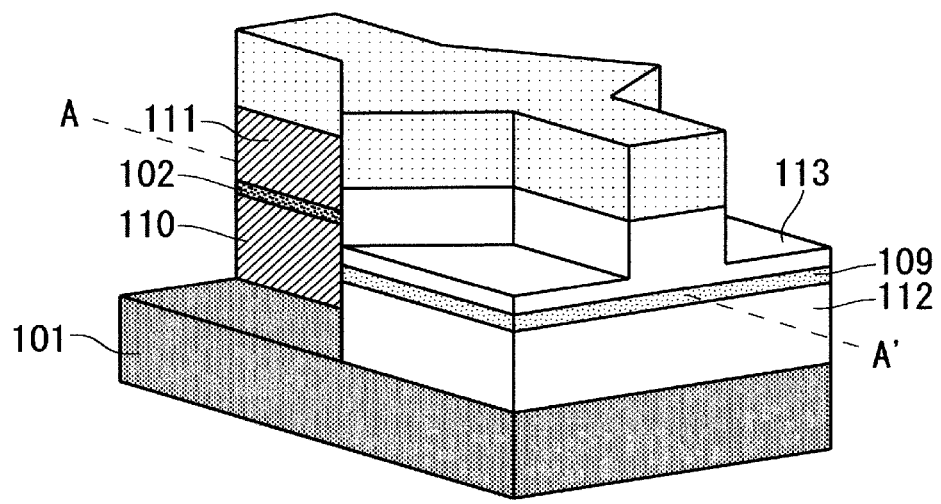

F I G . 3 7
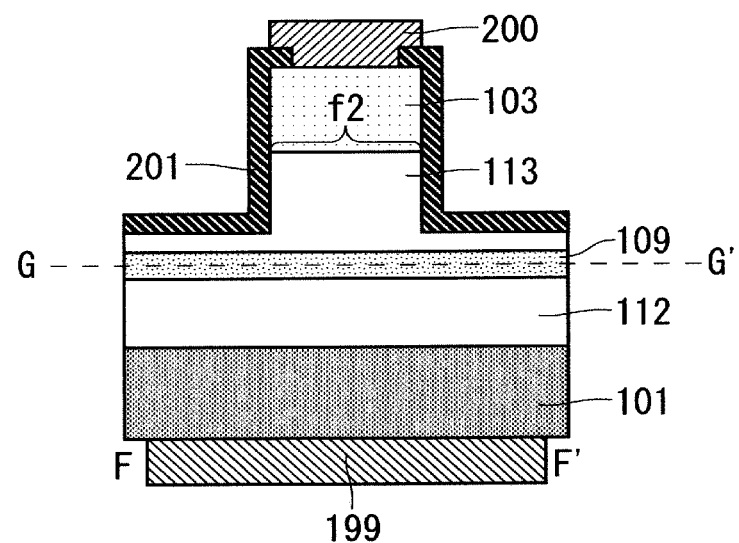

SEMICONDUCTOR OPTICAL WAVEGUIDE AND OPTICAL INTEGRATED ELEMENT

TECHNICAL FIELD

The present invention relates to a semiconductor optical waveguide disposed on a substrate, and an optical integrated element including the semiconductor optical waveguide.

BACKGROUND ART

In optical devices such as a semiconductor laser and an optical modulator, the structure of the device and the characteristics of the device are interrelated. For example, as the structures of optical devices, a buried waveguide, a ridge waveguide, and a deep ridge waveguide are known. The buried waveguide has a cross-sectional structure in which a core layer that propagates light, i.e., a core layer that guides light, is surrounded by cladding layers. The buried waveguide is more efficient in injecting a current into the core layer than a ridge waveguide, thus having characteristics suitable for low power-consumption operation. The ridge waveguide has a cross-sectional structure obtained in the following manner; that is, with a substrate lying on the bottom, a cross-sectional shape of a cladding layer on top of a core layer is patterned to have a ridge shape without patterning the core layer. The ridge waveguide has characteristics suitable for operation over a long time. The deep ridge waveguide has a large occupying proportion of a core layer with respect to the dimensions of the mode of guided light, thus having characteristics capable of modulating light with low power consumption as compared to other cross-sectional structures.

Incidentally, in an optical integrated element in which a plurality of functional elements such as a semiconductor laser and an optical modulator are integrated into one element, waveguides each having a different cross-sectional structure, such as a ridge structure that is a cross-sectional structure of a ridge waveguide and a buried structure that is a cross-sectional structure of a buried waveguide, may be integrated in order to satisfy requirements of each of the functional elements. In addition, the configuration in which waveguides each having a different cross-sectional structure are coupled to each other requires small loss of optical output.

However, when waveguides each having a different cross-sectional structure are simply coupled, reflection and radiation of light occur at the coupling portion between the waveguides because the shapes of the modes of light guided in the waveguides having their respective cross-sectional structures differ from each other. This results in increasing loss of optical output.

As a countermeasure, technology capable of reducing the above-mentioned loss of optical output has been reported. This technology is achieved by gradually changing one cross-sectional structure to another cross-sectional structure in a direction from one cross-sectional structure toward another cross-sectional structure at a portion to couple waveguides each having a different cross-sectional structure.

For example, Patent Document 1 discloses a cross-sectional structure for converting the shape of the mode of light including a ridge structure and a buried structure. Specifically, Patent Document 1 discloses technology in which the width and the thickness of an InP burying/cladding layer of a ridge structure are formed into a tapered shape, and the width and the thickness of an InP first cladding layer and an InGaAsP guiding layer of a buried structure are also formed into a tapered shape. According to such technology, one cross-sectional structure is gradually changed to be another cross-sectional structure in a direction from one cross-sectional structure toward another cross-sectional structure, and thus loss in converting the mode of light is reduced.

PRIOR ART DOCUMENT

Patent Document

Patent Document 1: Japanese Patent Application Laid-Open No. 7-174931 (1995)

SUMMARY

Problem to be Solved by the Invention

However, as in Patent Document 1, in the buried structure, the InP first cladding layer and the InGaAsP guiding layer are surrounded only by the InP burying/cladding layer and an InP substrate. Incidentally, when the buried structure is intended to be employed as an active element such as a laser and an optical modulator, the InP first cladding layer and the InGaAsP guiding layer correspond to a core layer into which a current is to be injected. Therefore, because a core layer is surrounded only by the InP burying/cladding layer and the InP substrate in the configuration of Patent Document 1, a current path in which a current flows only through the InP burying/cladding layer and the InP substrate without flowing through the core layer may be generated. If such a current path is generated, a current cannot be efficiently injected into the core layer of the buried waveguide.

Note that the generation of a current path in which a current flows from the InP burying/cladding layer directly into the InP substrate without flowing through the core layer can be reduced if a material having high current resistance is used in the InP burying/cladding layer. In this case, however, resistance of a current flowing from the InP burying/cladding layer through the core layer to the InP substrate is also increased. This results in even reducing the current, and thus no change is made in the inability to efficiently inject a current into the core layer of the buried waveguide.

Therefore, the present invention has been made in view of the problems as above, and has an object to provide a technology capable of efficiently injecting a current into a core layer of a buried waveguide.

Means to Solve the Problem

According to the present invention, a semiconductor optical waveguide disposed on a substrate includes a core layer having a refractive index higher than a refractive index of the substrate, a cladding layer having a refractive index lower than the refractive index of the core layer, and a current blocking layer having electrical resistance higher than electrical resistance of the core layer, and having a refractive index lower than the refractive index of the core layer. On one end side of the substrate, a buried waveguide including the core layer, the cladding layer, and the current blocking layer is disposed, both sides of the core layer in a layer-stacking direction are sandwiched by the cladding layer, and both sides of the core layer in a width direction that is perpendicular to the layer-stacking direction are sandwiched by the current blocking layer. On another end side of the substrate, a ridge waveguide including the core layer and the cladding layer is disposed, and both sides of the core layer in the layer-stacking direction are sandwiched by the cladding layer. A cross-sectional shape of a part of the cladding layer sandwiching the core layer and located away from the substrate has a ridge shape, and the buried waveguide and the ridge waveguide are coupled between the one end side and the another end side of the substrate.

Effects of the Invention

According to the present invention, in a buried waveguide, both sides of a core layer in a layer-stacking direction are sandwiched by a cladding layer, and both sides of a core layer in a width direction that is perpendicular to the layer-stacking direction are sandwiched by a current blocking layer. Consequently, a current can be efficiently injected into the core layer of the buried waveguide.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a cross-sectional view showing the configuration of the optical integrated element according to the first embodiment.

FIG. 6 is a cross-sectional view showing the configuration of the optical integrated element according to the first embodiment.

FIG. 7 is a cross-sectional view showing the configuration of the optical integrated element according to the first embodiment.

FIG. 8 is a perspective view showing the configuration of the optical integrated element according to the first embodiment.

FIG. 9 is a perspective view showing a method of manufacturing the optical integrated element according to the first embodiment.

FIG. 10 is a perspective view showing the method of manufacturing the optical integrated element according to the first embodiment.

FIG. 31 is a cross-sectional view showing the configuration of the optical integrated element according to the third embodiment.

FIG. 32 is a cross-sectional view showing the configuration of the optical integrated element according to the third embodiment.

FIG. 33 is a perspective view showing a method of manufacturing the optical integrated element according to the third embodiment.

FIG. 37 is a cross-sectional view showing the configuration of the optical integrated element according to the first, second, and third embodiments.

DESCRIPTION OF EMBODIMENTS

A semiconductor optical waveguide and an optical integrated element including the semiconductor optical waveguide according to embodiments of the present invention are described with reference to the drawings. The same components may be denoted by the same reference symbols to omit repeated description.

First Embodiment

Figure 1:
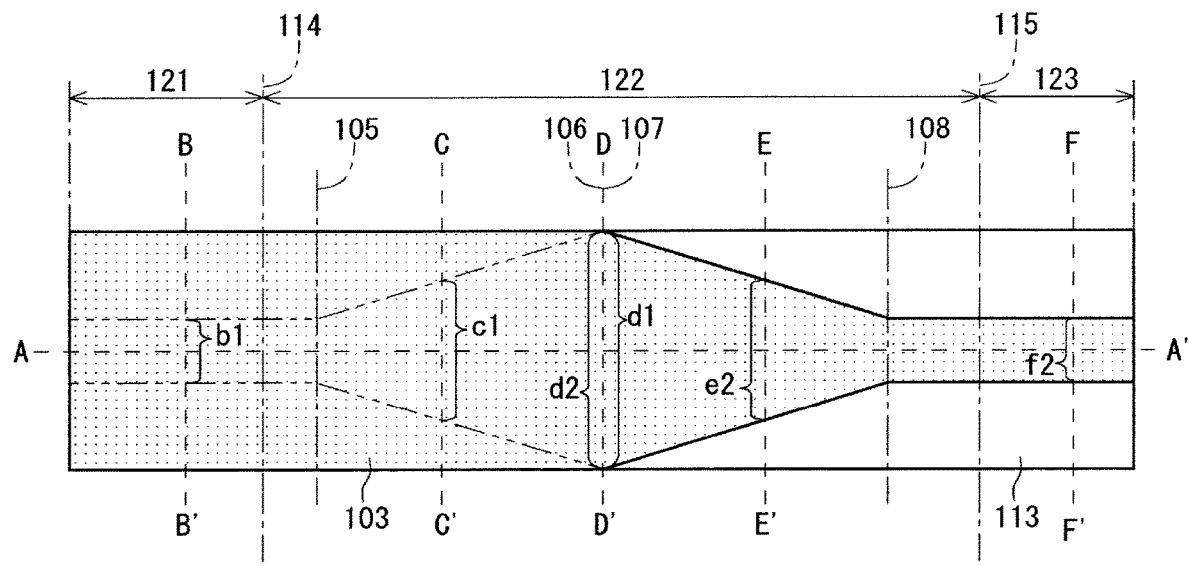
FIG. 1 is a top view showing the configuration of an optical integrated element according to a first embodiment.
Figure 2:
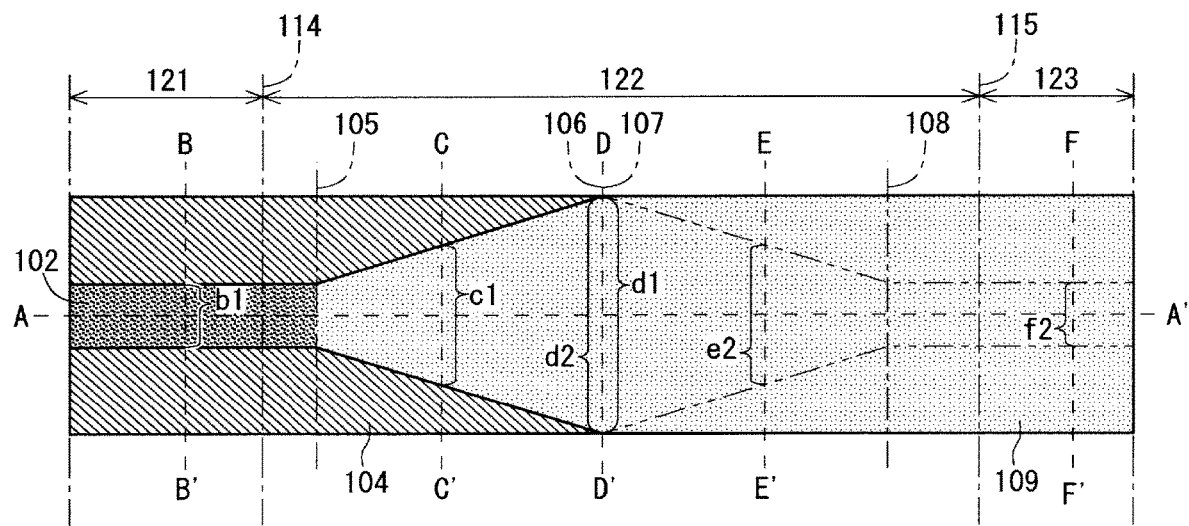
FIG. 2 is a cross-sectional view showing the configuration of the optical integrated element according to the first embodiment.

FIG. 1 is a top view showing the configuration of an optical integrated element according to a first embodiment of the present invention. FIG. 2 is a cross-sectional view of the configuration of the optical integrated element in top view. FIG. 1 and FIG. 2 show a waveguide direction A-A'.

FIG. 3, FIG. 4, FIG. 5, FIG. 6, and FIG. 7 are cross-sectional views of the configuration of the optical integrated element seen from a propagation direction of light, and are cross-sectional views taken along B-B', C-C', D-D', E-E', and F-F' of FIG. 1 and FIG. 2, respectively. FIG. 3 to FIG. 7 show the cross-section position G-G', along which the cross-sectional view of FIG. 2 is taken. Note that a top-to-bottom direction of FIG. 3 to FIG. 7 may be hereinafter referred to as a "layer-stacking direction," and a side-to-side direction that is perpendicular to the layer-stacking direction of FIG. 3 to FIG. 7 may be referred to as a "width direction." FIG. 8 is a perspective view showing the configuration of the optical integrated element.

As shown in FIG. 1 and FIG. 2, an optical integrated element according to the first embodiment includes a semiconductor laser 121, a connecting waveguide 122 as a semiconductor optical waveguide, and a modulator 123 such as an optical modulator. The semiconductor laser 121, the connecting waveguide 122, and the modulator 123 are disposed and integrated on an InP substrate 101, which is a single substrate shown in FIG. 3 to FIG. 8. Note that a direction of the InP substrate 101 from its one end side to another end side corresponds to the waveguide direction A-A' of FIG. 1 and FIG. 2. One end side of the InP substrate 101 may be hereinafter referred to as "one end side A," and another end side of the InP substrate 101 may be referred to as "another end side A'."

As shown in FIG. 1 and FIG. 2, the semiconductor laser 121 is connected to the connecting waveguide 122 at a portion of the connecting waveguide 122 corresponding to one end side A and a joining position 114. Further, the modulator 123 is connected to the connecting waveguide 122 at a portion of the connecting waveguide 122 corresponding to another end side A' and a joining position 115.

The connecting waveguide 122 has a function of guiding light emitted from the semiconductor laser 121 to the modulator 123. As will be apparent in the later description, the connecting waveguide 122 has a cross-sectional structure of a buried waveguide on one end side A, and a cross-sectional structure of a ridge waveguide on another end side A'. Moreover, the semiconductor laser 121 has a cross-sectional structure similar to that of the buried waveguide of the connecting waveguide 122, and the modulator 123 has a cross-sectional structure similar to that of the ridge waveguide of the connecting waveguide 122.

<Semiconductor Laser 121>

Figure 3:
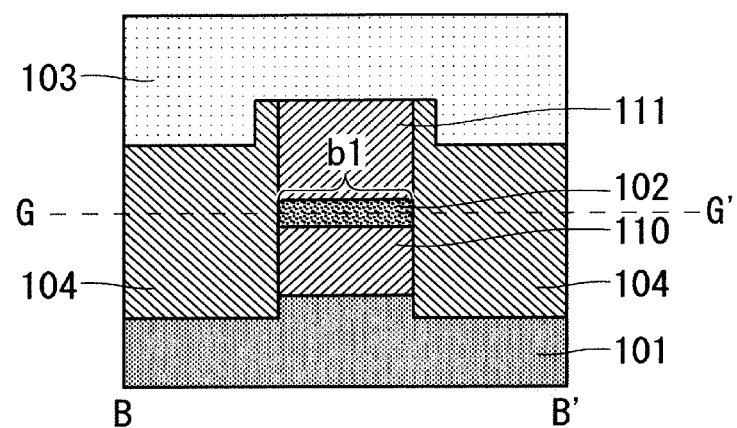
FIG. 3 is a cross-sectional view showing the configuration of the optical integrated element according to the first embodiment.

FIG. 3 is a cross-sectional view taken along B-B' of FIG. 1 and FIG. 2, and shows a cross-sectional structure of the semiconductor laser 121. The semiconductor laser 121 includes a first cladding layer 110, a first core layer 102, a second cladding layer 111, current blocking layers 104, and a fifth cladding layer 103, which are disposed on the InP substrate 101.

The first cladding layer 110 and the current blocking layers 104 are stacked on the InP substrate 101. The first core layer 102 and the second cladding layer 111 are stacked on the first cladding layer 110 in the mentioned order. The fifth cladding layer 103 is stacked on the current blocking layers 104 and the second cladding layer 111. Note that the first cladding layer 110 and the second cladding layer 111 are formed to have a refractive index lower than that of the first core layer 102. Therefore, radiation of light from the first core layer 102 to the first cladding layer 110 and the second cladding layer 111 is reduced to confine light in the first core layer 102.

Both right and left portions of each of the first cladding layer 110, the first core layer 102, and the second cladding layer 111 are patterned to be removed, and thus these layers extend in the layer-stacking direction. Moreover, the first cladding layer 110, the first core layer 102, and the second cladding layer 111 are buried in the current blocking layers 104 such that both sides of these layers in the width direction are sandwiched by the current blocking layers 104. Note that each current blocking layer 104 is formed to have a refractive index lower than that of the first core layer 102. Therefore, radiation of light from the first core layer 102 to the current blocking layers 104 is reduced to confine light in the first core layer 102.

As in the above, in the first embodiment, the semiconductor laser 121 has a cross-sectional structure of a buried waveguide that includes the first cladding layer 110, the first core layer 102, the second cladding layer 111, and the current blocking layers 104. Moreover, both sides of the first core layer 102 in the layer-stacking direction are sandwiched by the first cladding layer 110 and the second cladding layer 111, and both sides of the first core layer 102 in the width direction are sandwiched by the current blocking layers 104.

Here, each current blocking layer 104 is formed to have electrical resistance higher than that of the first core layer 102. Consequently, a current flowing from the fifth cladding layer 103 and the second cladding layer 111 is less liable to flow toward a region other than the first core layer 102 owing to the current blocking layers 104 having a current resistance value higher than that of the first core layer 102, thus efficiently flowing to the first core layer 102. Note that a semiconductor layer containing InP and any one of Zn, S, Fe, and Ru is used as the current blocking layer 104, for example.

<Modulator 123>

FIG. 7 is a cross-sectional view taken along F-F' of FIG. 1 and FIG. 2, and shows a cross-sectional structure of the modulator 123. The modulator 123 includes a third cladding layer 112, a second core layer 109, a fourth cladding layer 113, and a fifth cladding layer 103, which are disposed on the InP substrate 101.

The third cladding layer 112, the second core layer 109, the fourth cladding layer 113, and the fifth cladding layer 103 are stacked on the InP substrate 101 in the mentioned order. Note that the third cladding layer 112 and the fourth cladding layer 113 are formed to have a refractive index lower than that of the second core layer 109.

Both right and left portions of each of an upper portion of the fourth cladding layer 113 and the fifth cladding layer 103 are patterned to be removed, and thus the upper portion of the fourth cladding layer 113 and the fifth cladding layer 103 extend in the layer-stacking direction.

In this manner, in the first embodiment, the modulator 123 has a cross-sectional structure of a ridge waveguide that is obtained by patterning the fourth cladding layer 113 and the fifth cladding layer 103 as upper layers of the second core layer 109 without patterning the second core layer 109. Note that the ridge waveguide includes the third cladding layer 112, the second core layer 109, and the fourth cladding layer 113. Moreover, both sides of the second core layer 109 in the layer-stacking direction are sandwiched by the third cladding layer 112 and the fourth cladding layer 113, but both sides of the second core layer 109 in the width direction are not sandwiched by the current blocking layers 104.

Here, because the second core layer 109 is not patterned in the ridge waveguide, it is less liable that deterioration such as a defect in a patterned surface of the core layer that is generated due to the patterning expands in long-time operation.

Level difference between the upper surface of the fifth cladding layer 103 and the exposed upper surface of the fourth cladding layer 113 formed by the patterning may be hereinafter referred to as a "ridge depth," and the length of projection of the ridge portion of the ridge waveguide in the width direction may be referred to as a "ridge width." FIG. 7 shows a ridge width f2 as one example. In the first embodiment and a third embodiment described later, the ridge width is equal to each of the width of the fifth cladding layer 103 and the width of the upper portion of the fourth cladding layer 113, that is, equal to the width of the ridge shape which the cross-sectional shape of a part of the cladding layers located away from the InP substrate 101 has. In contrast, in a second embodiment described later, the ridge width is equal to each of the width of the fifth cladding layer 103 and the sum of the width of the upper portion of the fourth cladding layer 113 and the width of a part of the current blocking layers 104.

<Connecting Waveguide 122>

Next, the configuration of the connecting waveguide 122 is described. Prior to giving a detailed description of each configuration shown in FIG. 4 to FIG. 6, the overall configuration of the connecting waveguide 122 is described in detail.

Figure 4:
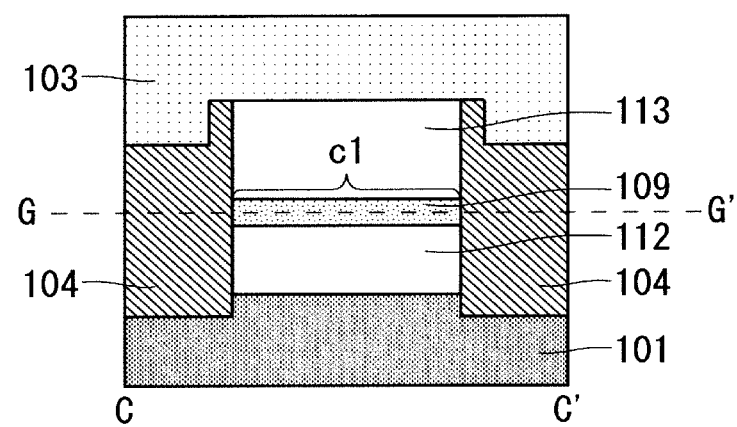
FIG. 4 is a cross-sectional view showing the configuration of the optical integrated element according to the first embodiment.

As shown in FIG. 4 to FIG. 6, the connecting waveguide 122 includes a third cladding layer 112, a second core layer 109, the fourth cladding layer 113, and a fifth cladding layer 103, which are disposed on the InP substrate 101. Moreover, as shown in FIG. 4, the connecting waveguide 122 further includes current blocking layers 104 at a position relatively close to one end side A, such as the position of C-C' of FIG. 1 and FIG. 2.

The second core layer 109 as a core layer has a refractive index higher than that of the InP substrate 101. In the first embodiment, the second core layer 109 contains InGaAsP or AlGaInAs.

The third cladding layer 112 and the fourth cladding layer 113 as cladding layers are formed to have a refractive index lower than that of the second core layer 109. Each current blocking layer 104 has electrical resistance higher than that of the second core layer 109, and has a refractive index lower than that of the second core layer 109.

In the first embodiment, at the joining position 114 shown in FIG. 1 and FIG. 2, the first cladding layer 110, the first core layer 102, and the second cladding layer 111 of FIG. 3 are respectively joined to the third cladding layer 112, the second core layer 109, and the fourth cladding layer 113 of FIG. 4 etc.

Although not shown in the drawings, a configuration in which the second core layer 109 of FIG. 4 etc. is thicker than the first core layer 102 of FIG. 3 is assumed in the first embodiment. In this configuration, if the thickness of the second cladding layer 111 and the thickness of the fourth cladding layer 113 are equal, level difference corresponding to difference between the thickness of the first core layer 102 and the thickness of the second core layer 109 appears between the upper surface of the second cladding layer 111 and the upper surface of the fourth cladding layer 113. The level difference may cause difficulty in forming an electrode etc. (not shown) of the optical integrated element.

In view of this, in the first embodiment, the fourth cladding layer 113 is thinner than the second cladding layer 111. This configuration can reduce level difference between the upper surface of the second cladding layer 111 and the upper surface of the fourth cladding layer 113. Further, similarly, in order to reduce level difference between a lower surface of the first cladding layer 110 and a lower surface of the third cladding layer 112, the third cladding layer 112 is thinner than the first cladding layer 110.

Further, in the configuration in which the second core layer 109 of FIG. 4 etc. is thicker than the first core layer 102 of FIG. 3, the shape of a mode of light formed by the first cladding layer 110, the first core layer 102, and the second cladding layer 111 of FIG. 3 is different from the shape of a mode of light formed by the third cladding layer 112, the second core layer 109, and the fourth cladding layer 113 of FIG. 4 etc. In this manner, if the shapes of both the modes of light are different, reflection of light as well as loss of light may occur at the joining position 114. In view of this, in the first embodiment, in order to make a difference between a refractive index of the first cladding layer 110 and a refractive index of the third cladding layer 112 and between a refractive index of the second cladding layer 111 and a refractive index of the fourth cladding layer 113, different materials are used in these layers. This configuration produces the same shape in both the modes of light.

As in the above, in the first embodiment, the thickness and the material that determines a refractive index differ between the first cladding layer 110 and the third cladding layer 112, and between the second cladding layer 111 and the fourth cladding layer 113. However, when the above-mentioned level difference is not considered a problem or when the difference of the shapes of the modes of light is of a degree that may be ignored, for example, the first cladding layer 110 and the third cladding layer 112 may be the same, and the second cladding layer 111 and the fourth cladding layer 113 may be the same.

Except the above-mentioned difference, in the first embodiment, the cross-sectional structure of the semiconductor laser 121 and the cross-sectional structure from the joining position 114 of the connecting waveguide 122 to a core-layer width change start position 105 are the same. The core-layer width change start position 105 is a position where the width of the second core layer 109 of the connecting waveguide 122 starts to change. Therefore, similarly to the configuration in which the semiconductor laser 121 of FIG. 3 has a cross-sectional structure of a buried waveguide that includes the first core layer 102, the first and second cladding layers 110 and 111, and the current blocking layers 104, the connecting waveguide 122 of FIG. 4 also has a cross-sectional structure of a buried waveguide that includes the second core layer 109, the third and fourth cladding layers 112 and 113, and the current blocking layers 104. Moreover, in the buried waveguide of the connecting waveguide 122, both sides of the second core layer 109 in the layer-stacking direction are sandwiched by the third and fourth cladding layers 112 and 113, and both sides of the second core layer 109 in the width direction are sandwiched by the current blocking layers 104.

Similarly, in the first embodiment, the cross-sectional structure of the modulator 123 and the cross-sectional structure from a ridge width change end position 108 to the joining position 115 are the same. The ridge width change end position 108 is a position where the ridge width of the connecting waveguide 122 becomes the ridge width f2 of the modulator 123. Therefore, similarly to the configuration in which the modulator 123 of FIG. 7 has a cross-sectional structure of a ridge waveguide that includes the second core layer 109 and the third and fourth cladding layers 112 and 113, the connecting waveguide 122 of FIG. 6 also has a cross-sectional structure of a ridge waveguide that includes the second core layer 109 and the third and fourth cladding layers 112 and 113. Moreover, in the ridge waveguide of the connecting waveguide 122, both sides of the second core layer 109 in the layer-stacking direction are sandwiched by the third and fourth cladding layers 112 and 113, but both sides of the second core layer 109 in the width direction are not sandwiched by the current blocking layers 104.

The buried waveguide and the ridge waveguide of the connecting waveguide 122 are coupled, i.e., optically coupled, between one end side A and another end side A'. In the first embodiment, in a direction from one waveguide among the buried waveguide and the ridge waveguide toward the other, one waveguide structure is gradually changed to the other waveguide structure. This is described in detail below.

As shown FIG. 1 and FIG. 2, between the joining position 114 and the core-layer width change start position 105, the width of the second core layer 109 of the connecting waveguide 122 is constant, and is equal to a width b1 of the first core layer 102 of the semiconductor laser 121. Similarly, each width of the third and fourth cladding layers 112 and 113 is also constant, and is equal to the width b1 of the first core layer 102 of the semiconductor laser 121.

FIG. 4 is a cross-sectional view taken along C-C' of FIG. 1 and FIG. 2, and shows a cross-sectional structure of the connecting waveguide 122 at a point midway between the core-layer width change start position 105 and a core-layer width change end position 106. The core-layer width change end position 106 is a position where a width c1 of the second core layer 109 of the connecting waveguide 122 becomes equal to a width d1 of the second core layer 109 of the modulator 123. FIG. 5 is a cross-sectional view taken along D-D' of FIG. 1 and FIG. 2, and shows a cross-sectional structure of the connecting waveguide 122 at the core-layer width change end position 106. The cross-sectional structure of the connecting waveguide 122 between the joining position 114 and the core-layer width change end position 106 corresponds to the above-mentioned cross-sectional structure of the buried waveguide.

As shown in FIG. 1 and FIG. 2, between the core-layer width change start position 105 and the core-layer width change end position 106, the width c1 of the second core layer 109 gradually widens from the width b1 to the width d1 in a direction from the core-layer width change start position 105 toward the core-layer width change end position 106. In this manner, in the first embodiment, between one end side A and another end side A', the second core layer 109 has a portion of a reversely tapered shape in which the width of the second core layer 109 becomes larger in a direction from one end side A toward another end side A'. Similarly to the widening of the width c1 of the second core layer 109, each width of the third and fourth cladding layers 112 and 113 also gradually widens from the width b1 to the width d1. This widening in turn reduces each width of the two current blocking layers 104 that sandwich the second core layer 109. At the core-layer width change end position 106, as in FIG. 5, the current blocking layers 104 end, and each width d1 of the second core layer 109 and the third and fourth cladding layers 112 and 113 is equal to the width of the InP substrate 101 instead.

The gradual change of the width c1 of the second core layer 109 and the width of the current blocking layers 104 gradually widens the width of the mode of light guided from the core-layer width change start position 105 to the core-layer width change end position 106, which has been confined due to difference in the refractive indices between the second core layer 109 and each current blocking layer 104, while loss of light is reduced.

Here, the current blocking layers 104 each having a current resistance value higher than that of the second core layer 109 sandwich the second core layer 109 at any position between the core-layer width change start position 105 and the core-layer width change end position 106. Therefore, a current flowing through the current blocking layers 104 without flowing through the second core layer 109 is reduced, and thus a current can be efficiently injected into the second core layer 109.

Further, the current blocking layers 104 do not exist from the core-layer width change end position 106 to the modulator 123. Consequently, the width of the mode of light guided from the core-layer width change end position 106 to the modulator 123 is determined by the ridge width that is the width of the projection of the ridge portion of the ridge waveguide.

In the first embodiment, the core-layer width change end position 106 and a ridge width change start position 107 are located at the same position. The cross-sectional structure at the ridge width change start position 107 is the same as the cross-sectional structure (FIG. 5) at the core-layer width change end position 106, and both the cross-sectional structures are a slab waveguide structure. Note that a ridge width d2 is equal to the width of the InP substrate 101 at the ridge width change start position 107.

FIG. 6 is a cross-sectional view taken along E-E' of FIG. 1 and FIG. 2, and shows a cross-sectional structure of the connecting waveguide 122 at a point midway between the ridge width change start position 107 and a ridge width change end position 108, which is a position where the ridge width d2 becomes equal to the ridge width f2 of the modulator 123. The cross-sectional structure of the connecting waveguide 122 between the ridge width change start position 107 and the joining position 115 corresponds to the above-mentioned cross-sectional structure of the ridge waveguide. The ridge depth of the connecting waveguide 122 is equal to the ridge depth of the modulator 123.

As shown in FIG. 1 and FIG. 2, between the ridge width change start position 107 and the ridge width change end position 108, a ridge width e2 is gradually reduced in a direction from the ridge width change start position 107 toward the ridge width change end position 108. In this manner, in the first embodiment, between one end side A and another end side A', the ridge portion of the ridge waveguide has a portion of a tapered shape in which the width of projection of the ridge portion becomes smaller in a direction from one end side A toward another end side A'.

As shown in FIG. 1 and FIG. 2, between the ridge width change end position 108 and the joining position 115, the ridge width of the connecting waveguide 122 is constant, and is equal to the ridge width f2 of the modulator 123. Since the layer configuration and the ridge width of the connecting waveguide 122 at the joining position 115 are the same as those of the modulator 123, the cross-sectional structure of the connecting waveguide 122 at the joining position 115 is the same as the cross-sectional structure of the modulator 123.

The gradual reduction of the ridge width from the ridge width change start position 107 to the ridge width change end position 108 gradually intensifies the influence of difference in the refractive indices between the fifth cladding layer 103 and the fourth cladding layer 113 in the ridge and air in the patterned portion over the width of the mode of light. As a result, the width of the mode of light guided from the ridge width change start position 107 to the ridge width change end position 108 is gradually reduced while loss of light is reduced.

Further, the current blocking layers 104 sandwiching the second core layer 109 do not exist from the core-layer width change end position 106 to the modulator 123, and the width of the second core layer 109 is equal to the width of the InP substrate 101. Therefore, the width of the mode of light is determined solely by the ridge width. Since the ridge width of the connecting waveguide 122 at the joining position 115 is equal to the ridge width f2 of the modulator 123, the mode of light of the connecting waveguide 122 at the joining position 115 and the mode of light of the modulator 123 have the same shape.

Next, the structure of applying a voltage to the semiconductor laser 121 and the modulator 123 is described.

Figure 35:
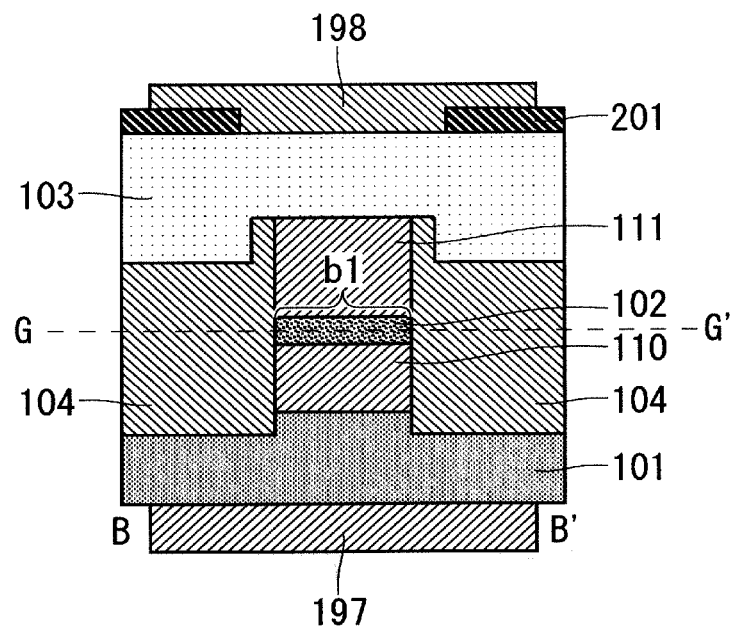
FIG. 35 is a cross-sectional view showing the configuration of the optical integrated element according to the first and second embodiments.

First, description for the semiconductor laser 121 is given. In the structure of the buried waveguide of FIG. 3 etc. described in the above, electrodes 197 and 198 of FIG. 35 are respectively provided under the InP substrate 101 and on top of the fifth cladding layer. A voltage is applied to the two electrodes. As in FIG. 35, an insulation film or a dielectric layer 201 may be provided between the fifth cladding layer 103 and the electrode 198 and in a region other than the region above the first core layer 102 such that a current does not flow in a region other than the first core layer 102.

Next, description for the modulator 123 is given. In the structure of the ridge waveguide of FIG. 7 etc. described in the above, electrodes 199 and 200 of FIG. 37 are respectively provided under the InP substrate 101 and on top of the fifth cladding layer 103. A voltage is applied to the two electrodes. As in FIG. 37, a surface of the ridge waveguide may be covered by an insulation film or a dielectric layer 201, and the insulation film or the dielectric layer 201 may be removed only from the top of the fifth cladding layer 103 to expose the fifth cladding layer 103 such that the electrode 200 may be provided on the exposed top of the fifth cladding layer 103.

<Manufacturing Method>

Next, a method of manufacturing the optical integrated element according to the first embodiment as described above is described. First, as shown in FIG. 9, the first cladding layer 110, the first core layer 102, and the second cladding layer 111 to form a buried waveguide are stacked on the InP substrate 101 in order.

Subsequently, as shown in FIG. 10, a region of these layers that has a length in the width direction equal to the width of the InP substrate 101, a length in the waveguide direction A-A' from the joining position 114 to the end portion of the modulator 123, and a length in the depth direction from the second cladding layer 111 to the InP substrate 101 is patterned to be removed.

Figure 11:
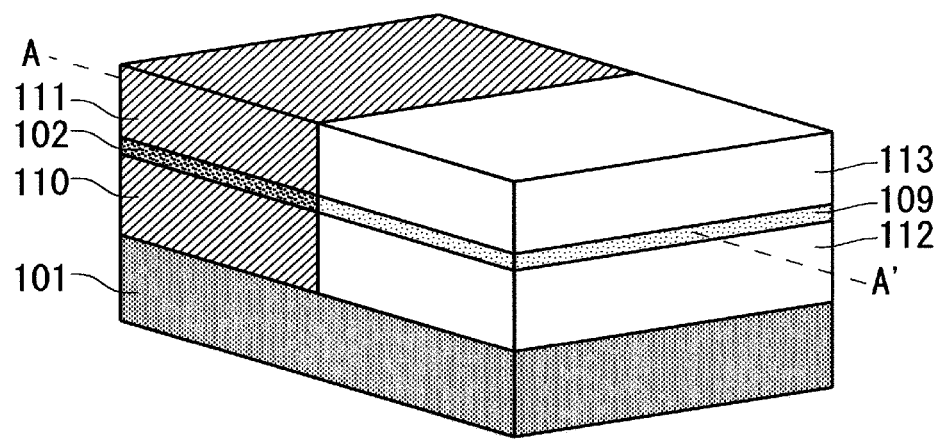
FIG. 11 is a perspective view showing the method of manufacturing the optical integrated element according to the first embodiment.

Next, as shown in FIG. 11, the third cladding layer 112, the second core layer 109, and the fourth cladding layer 113 to form a ridge waveguide are grown in the removed region on the InP substrate 101.

Figure 12:
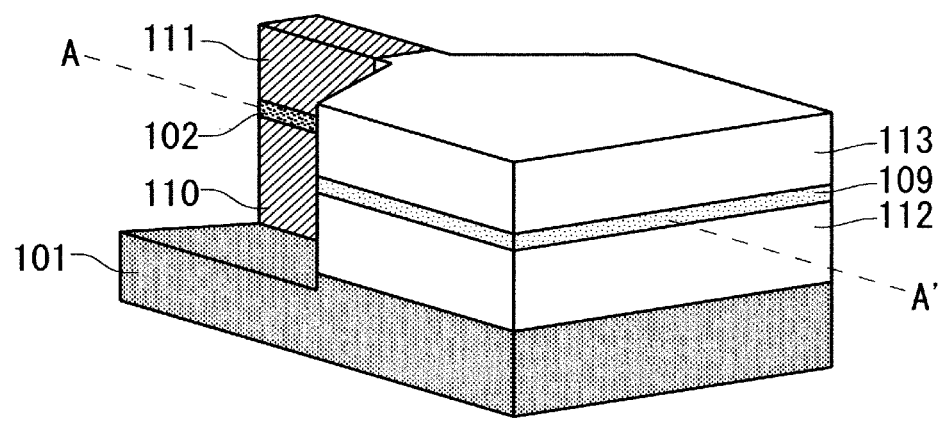
FIG. 12 is a perspective view showing the method of manufacturing the optical integrated element according to the first embodiment.

Then, as shown in FIG. 12, a region ranging from the end portion of the semiconductor laser 121 to the core-layer width change end position 106 of the connecting waveguide 122 and having a length in the depth direction from the second cladding layer 111 to the InP substrate 101 is patterned to be removed such that the width of the first and second core layers 102 and 109 becomes the above-mentioned width.

Figure 13:
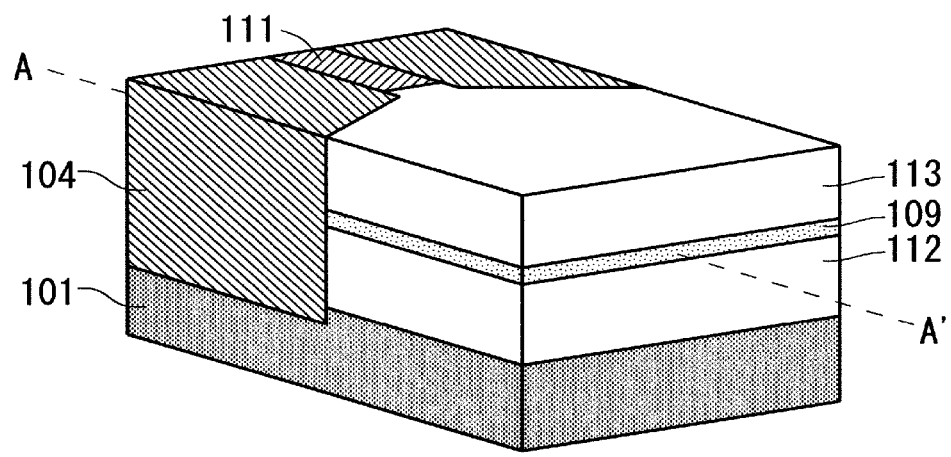
FIG. 13 is a perspective view showing the method of manufacturing the optical integrated element according to the first embodiment.

Next, as shown in FIG. 13, the current blocking layers 104 are stacked on the removed region on the InP substrate 101.

Figure 14:
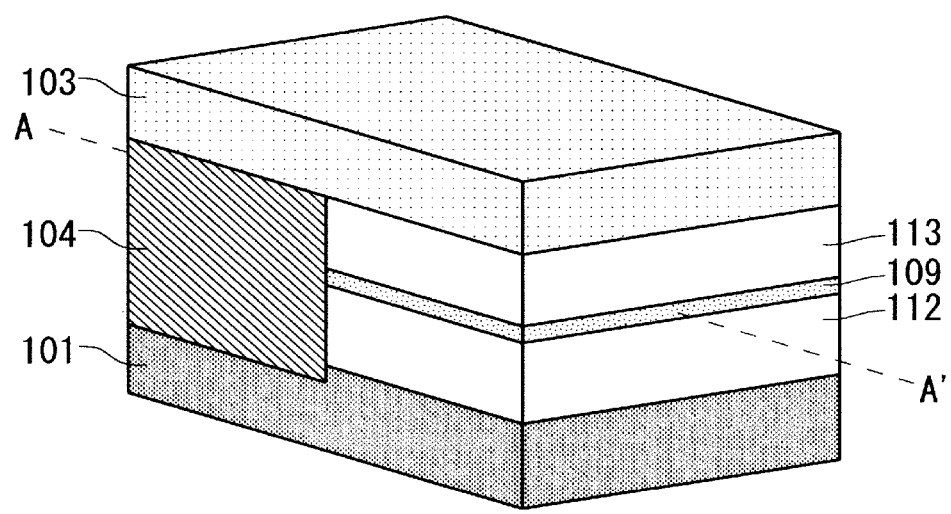
FIG. 14 is a perspective view showing the method of manufacturing the optical integrated element according to the first embodiment.

Subsequently, as shown in FIG. 14, the fifth cladding layer 103 is stacked on the second and fourth cladding layers 111 and 113 and the current blocking layers 104.

Figure 15:
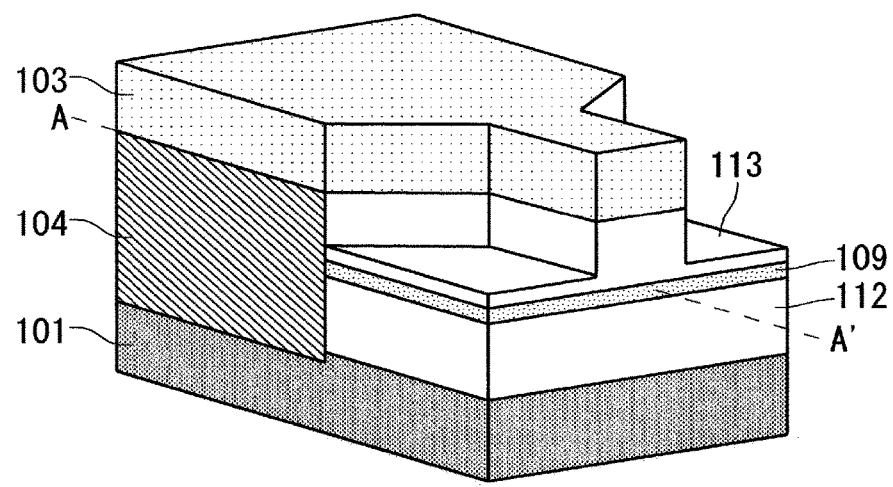
FIG. 15 is a perspective view showing the method of manufacturing the optical integrated element according to the first embodiment.

Next, as shown in FIG. 15, a region ranging from the ridge width change start position 107 of the connecting waveguide 122 to the end portion of the modulator 123 and having a length in the depth direction from the fifth cladding layer 103 to a part of the fourth cladding layer 113 is patterned to be removed such that the ridge width becomes the above-mentioned width.

Finally, the electrode 197, the electrode 198, the electrode 199, and the electrode 200 of FIG. 35 and FIG. 37 described above are disposed in respective regions of the buried waveguide and the ridge waveguide. In this manner, the optical integrated element according to the first embodiment can be manufactured. Note that, in the above manufacturing method, the processing steps of stacking layers and processes consist only of a process of stacking layers in uniform thickness distribution and a process performed in constant depth distribution. This accordingly is a highly reproductive manufacturing method, and is a method capable of manufacturing optical integrated elements in good yield.

<Gist of First Embodiment>

According to the semiconductor optical waveguide and the optical integrated element of the first embodiment as described above, the width of the second core layer 109 and the ridge width gradually change from the core-layer width change start position 105 to the ridge width change end position 108. Therefore, the shape of the mode of light guided by the semiconductor laser 121 of the buried waveguide can be converted into the shape of the mode of light guided by the modulator 123 of the ridge waveguide while loss of light is reduced. Further, in a region from the buried waveguide to the core-layer width change end position 106, the first core layer 102 and the second core layer 109 are surrounded by the first and second cladding layers 110 and 111 or the third and fourth cladding layers 112 and 113 and the current blocking layers 104. Therefore, a current can be efficiently injected into the first core layer 102 and the second core layer 109.

Second Embodiment

Figure 16:
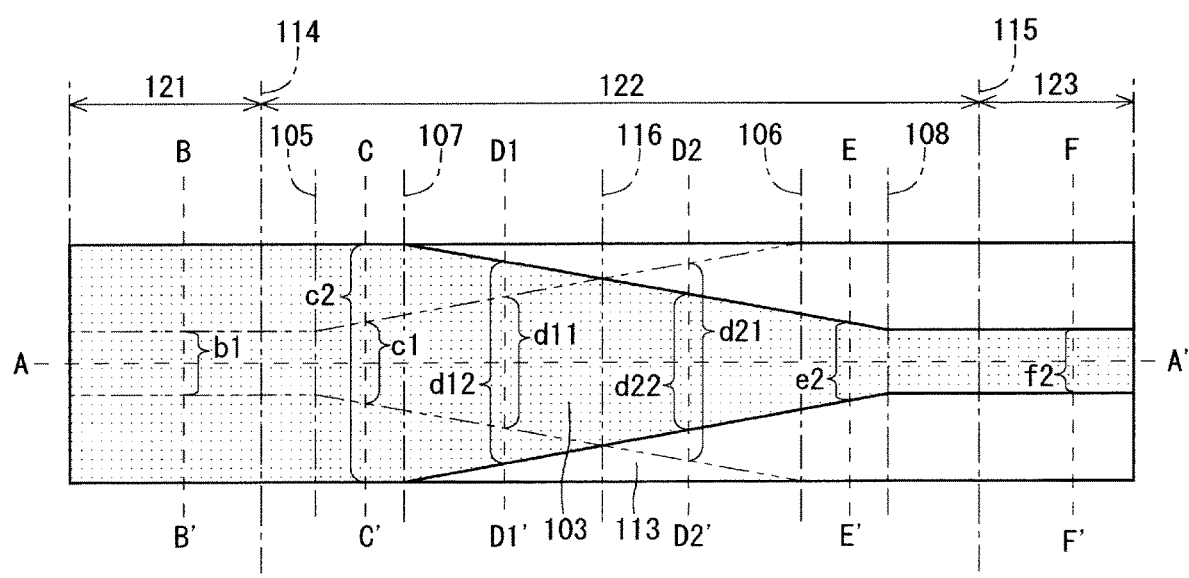
FIG. 16 is a top view showing the configuration of an optical integrated element according to a second embodiment.
Figure 17:
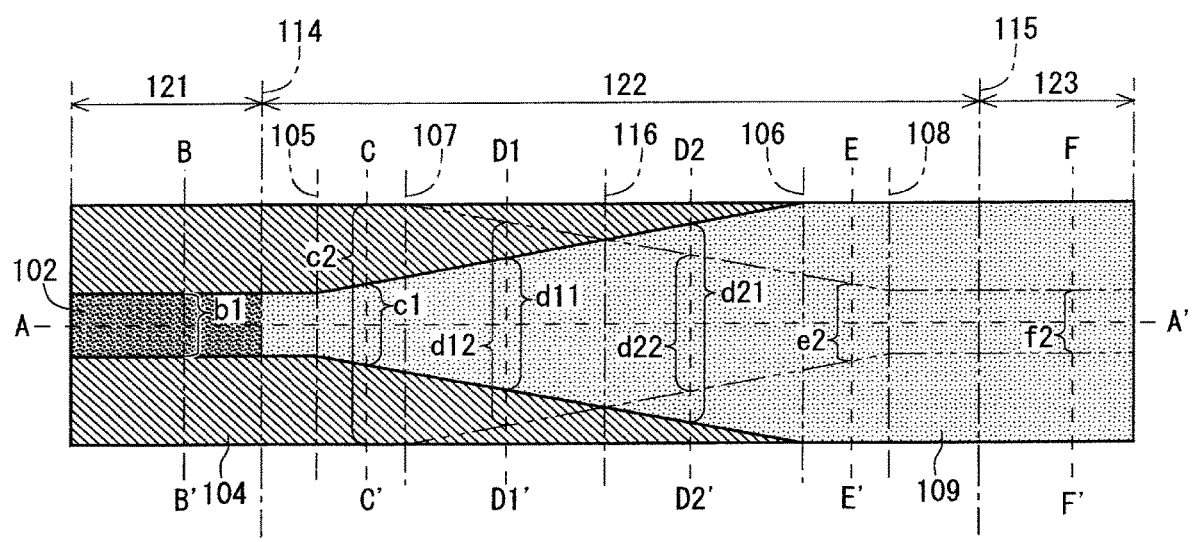
FIG. 17 is a cross-sectional view showing the configuration of the optical integrated element according to the second embodiment.

In the first embodiment, as shown in FIG. 1 and FIG. 2, the core-layer width change end position 106 and the ridge width change start position 107 are located at the same position, but this configuration is not restrictive. FIG. 16 is a top view showing the configuration of an optical integrated element according to a second embodiment of the present invention. FIG. 17 is a cross-sectional view of the configuration of the optical integrated element in top view.

Figure 22:
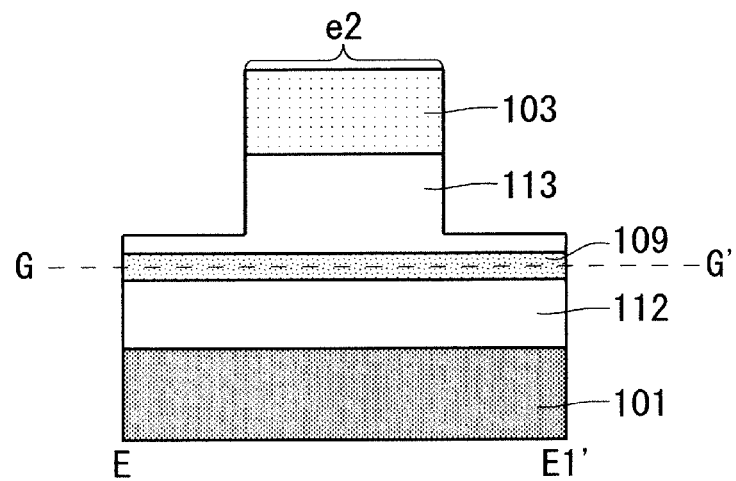
FIG. 22 is a cross-sectional view showing the configuration of the optical integrated element according to the second embodiment.
Figure 23:
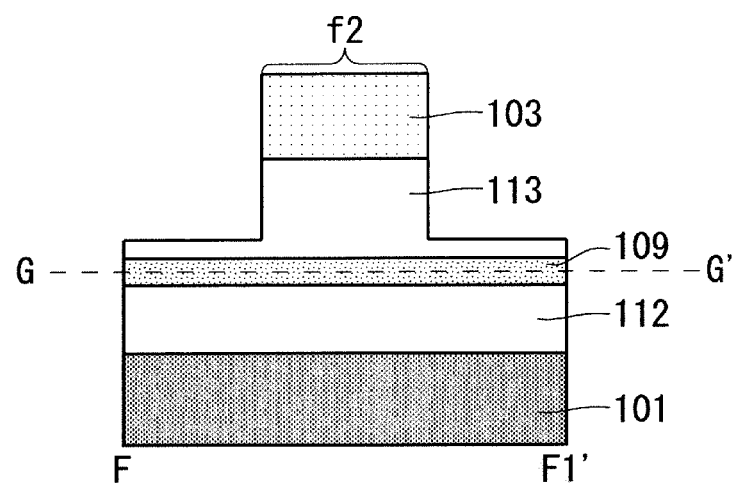
FIG. 23 is a cross-sectional view showing the configuration of the optical integrated element according to the second embodiment.
Figure 24:
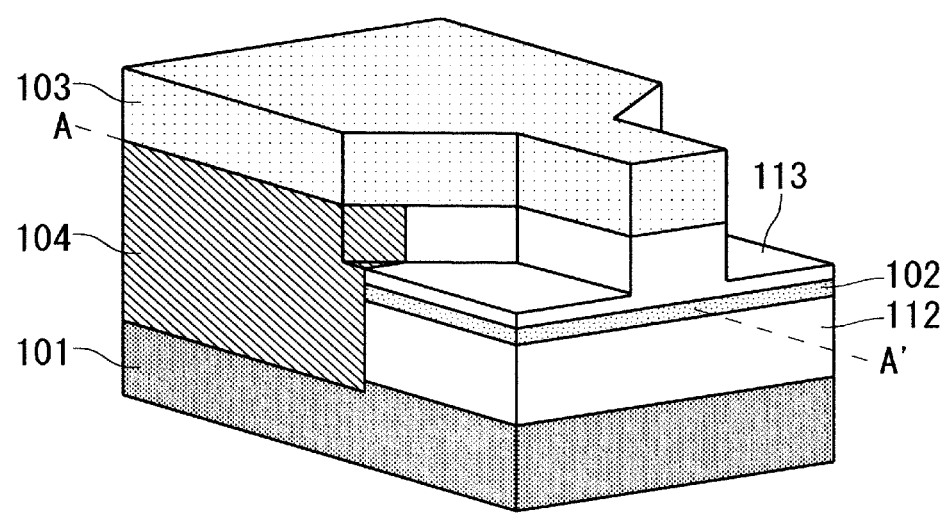
FIG. 24 is a perspective view showing the configuration of the optical integrated element according to the second embodiment.

FIG. 18, FIG. 19, FIG. 20, FIG. 21 FIG. 22, and FIG. 23 are cross-sectional views of the configuration of the optical integrated element seen from a propagation direction of light, and are cross-sectional views taken along B-B', C-C', D1-D1', D2-D2', E-E', and F-F' of FIG. 16 and FIG. 17, respectively. FIG. 18 to FIG. 23 show the cross-section position G-G', along which the cross-sectional view of FIG. 17 is taken. FIG. 24 is a perspective view showing the configuration of the optical integrated element.

Figure 18:
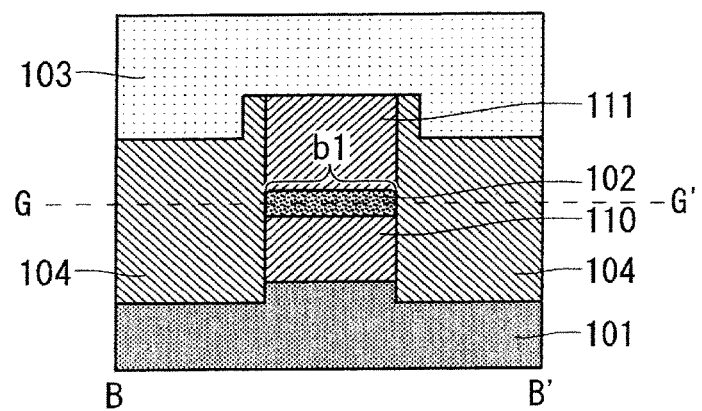
FIG. 18 is a cross-sectional view showing the configuration of the optical integrated element according to the second embodiment.

As shown in FIG. 18, the cross-sectional structure of the semiconductor laser 121 according to the second embodiment is the same as the cross-sectional structure (FIG. 3) of the semiconductor laser 121 according to the first embodiment. Further, as shown in FIG. 23, the cross-sectional structure of the modulator 123 according to the second embodiment is the same as the cross-sectional structure (FIG. 7) of the modulator 123 according to the first embodiment.

In addition, in the second embodiment, the cross-sectional structure of the connecting waveguide 122 is formed such that the start of core-layer width change, the start of ridge width change, the end of core-layer width change, and the end of ridge width change are located in order in a direction from the semiconductor laser 121 toward the modulator 123. In this case, the cross-sectional structure of the connecting waveguide 122 is formed to change from a first cross-sectional structure to a fourth cross-sectional structure (described below) in order in a direction from the core-layer width change start position 105 toward the ridge width change end position 108.

Figure 19:
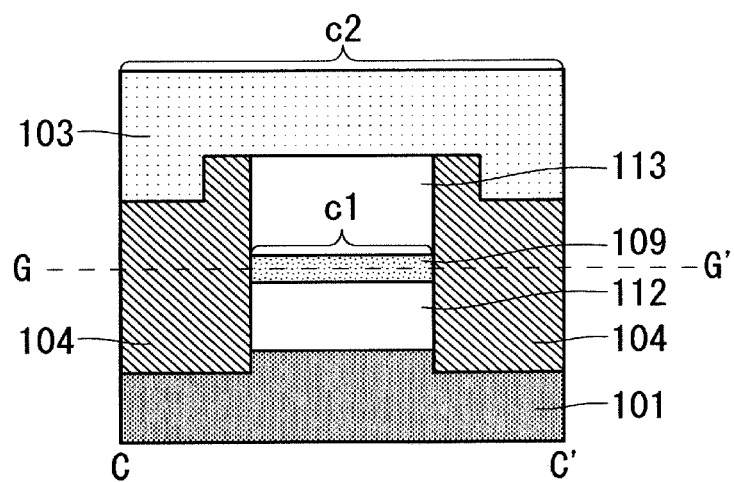
FIG. 19 is a cross-sectional view showing the configuration of the optical integrated element according to the second embodiment.

FIG. 19 is a cross-sectional view taken along C-C' of FIG. 16 and FIG. 17, and is a cross-sectional view showing a first cross-sectional structure that ranges from the core-layer width change start position 105 to the ridge width change start position 107. As shown in FIG. 19, the first cross-sectional structure is the same as the cross-sectional structure (FIG. 4) from the core-layer width change start position 105 to the core-layer width change end position 106 described in the first embodiment. The description of the cross-sectional structure is thus omitted herein.

Figure 20:
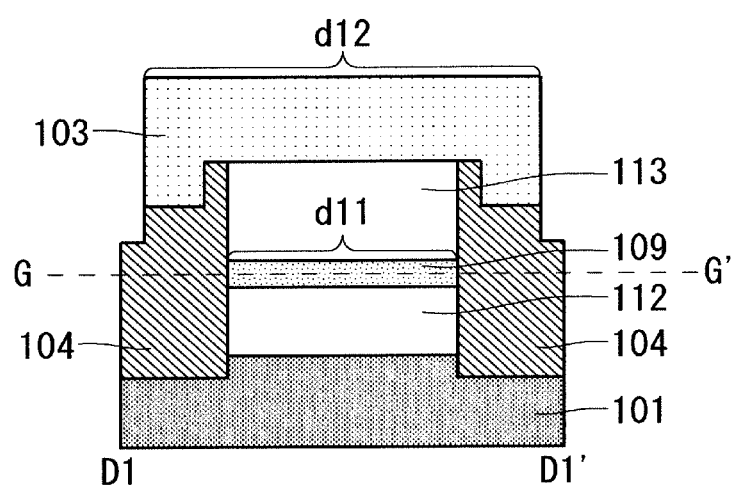
FIG. 20 is a cross-sectional view showing the configuration of the optical integrated element according to the second embodiment.

FIG. 20 is a cross-sectional view taken along D1-D1' of FIG. 16 and FIG. 17, and is a cross-sectional view showing a second cross-sectional structure that ranges from the ridge width change start position 107 to a width equivalent position 116. The width equivalent position 116 is a position where the width of the second core layer 109 and the ridge width are equal. In the second cross-sectional structure, a width d11 of the second core layer 109 and the width of the third and fourth cladding layers 112 and 113 are gradually widened in a direction from the ridge width change start position 107 toward the width equivalent position 116. At the same time, a ridge width d12 of the ridge portion of the ridge waveguide is gradually reduced within a range of securing a width larger than the width d11 of the second core layer 109 and smaller than the width of the InP substrate 101 in a direction from the ridge width change start position 107 toward the width equivalent position 116.

Figure 21:
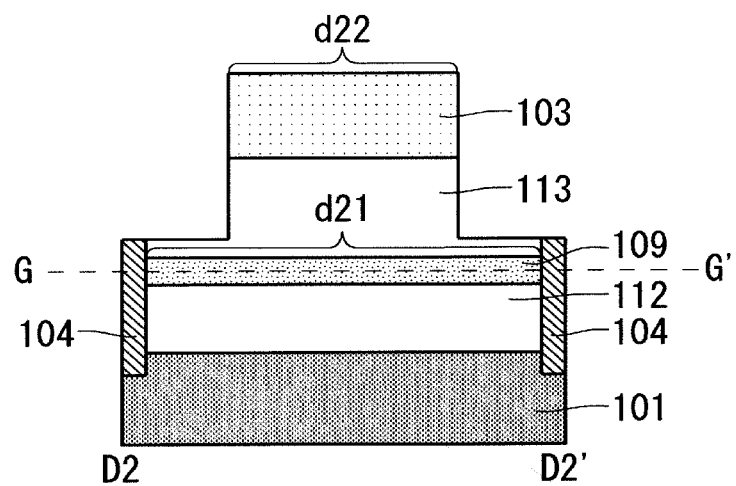
FIG. 21 is a cross-sectional view showing the configuration of the optical integrated element according to the second embodiment.

FIG. 21 is a cross-sectional view taken along D2-D2' of FIG. 16 and FIG. 17, and is a cross-sectional view showing a third cross-sectional structure that ranges from the width equivalent position 116 to the core-layer width change end position 106. In the third cross-sectional structure, a width d21 of the second core layer 109 and the width of the third and fourth cladding layers 112 and 113 are gradually widened in a direction from the width equivalent position 116 toward the core-layer width change end position 106. At the same time, a ridge width d22 of the ridge portion of the ridge waveguide is gradually reduced within a range of securing a width smaller than the width d21 of the second core layer 109 and larger than the ridge width f2 of the modulator 123 in a direction from the width equivalent position 116 toward the core-layer width change end position 106.

FIG. 22 is a cross-sectional view taken along E-E' of FIG. 16 and FIG. 17, and is a cross-sectional view showing a fourth cross-sectional structure that ranges from the core-layer width change end position 106 to the ridge width change end position 108. As shown in FIG. 22, the fourth cross-sectional structure is the same as the cross-sectional structure (FIG. 6) from the ridge width change start position 107 to the ridge width change end position 108 described in the first embodiment. The description of the cross-sectional structure is thus omitted herein.

Needless to say, a method of manufacturing the optical integrated element according to the second embodiment as described above can be implemented by either of the following manners; that is, in the manufacturing method described in the first embodiment, bringing the core-layer width change end position 106 closer to the ridge width change end position 108 in the patterning of FIG. 12, bringing the ridge width change start position 107 closer to the core-layer width change start position 105 in the patterning of FIG. 15, or performing both of these.

Gist of Second Embodiment

Also according to the semiconductor optical waveguide and the optical integrated element of the second embodiment as described above, similar effects to those of the first embodiment can be achieved. That is to say, not only the shape of the mode of light can be converted while loss of light is reduced, but a current can be efficiently injected into the first core layer 102 and the second core layer 109 as well.

Third Embodiment

Figure 26:
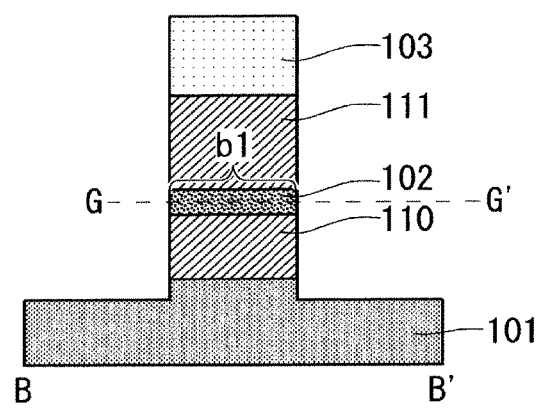
FIG. 26 is a cross-sectional view showing the configuration of an optical integrated element according to a third embodiment.

In the first embodiment and the second embodiment, as in FIG. 3 and FIG. 18, each current blocking layer 104 is a semiconductor having a lower refractive index and higher electrical resistance than those of the first core layer 102, and the cross-sectional structure of a portion taken along B-B', for example, has a structure of a buried waveguide. However, if the current blocking layers 104 are replaced by air, air has a lower refractive index and higher electrical resistance than those of the first core layer 102. In this case, if the width of the fifth cladding layer 103 is equal to the width of the first core layer 102, the cross-sectional structure of a portion taken along B-B', for example, corresponds to a structure of a deep ridge waveguide as in FIG. 26.

Figure 27:
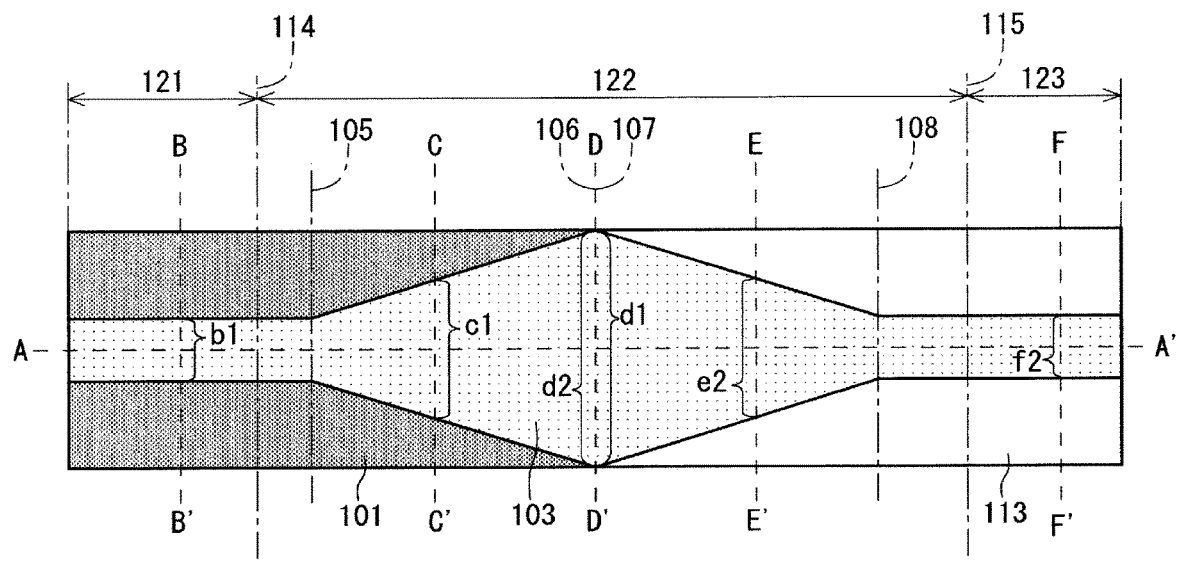
FIG. 27 is a top view showing the configuration of the optical integrated element according to the third embodiment.
Figure 28:
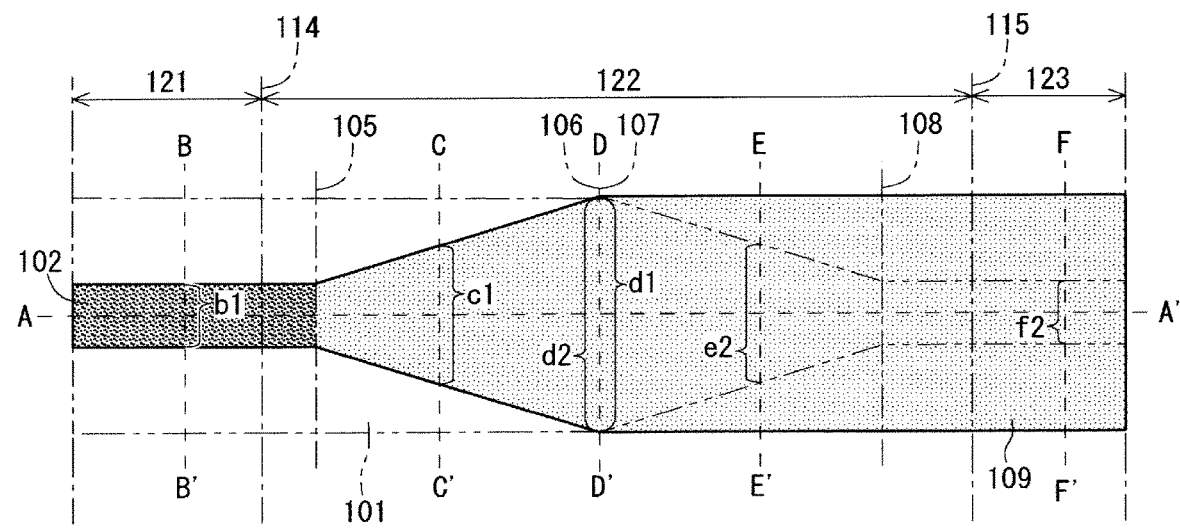
FIG. 28 is a top view showing the configuration of the optical integrated element according to the third embodiment.
Figure 29:
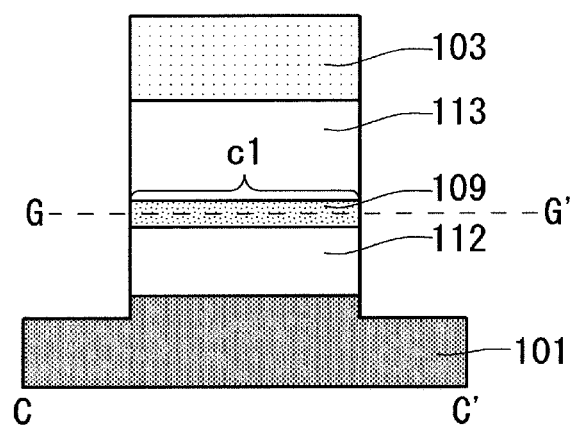
FIG. 29 is a cross-sectional view showing the configuration of the optical integrated element according to the third embodiment.

Here, as in FIG. 27 and FIG. 28, in the structure of the first embodiment, the current blocking layers are replaced by air, and the width of the fifth cladding layer 103 is replaced so as to exhibit the same change as the change of the width of the second core layer 109 from the core-layer width change start position to the core-layer width change end position. Such a replaced structure enables a structure in which the mode of light can be converted from the deep ridge waveguide to the ridge waveguide without loss, and a current can be efficiently injected into the first core layer 102 and the second core layer 109.

Figure 30:
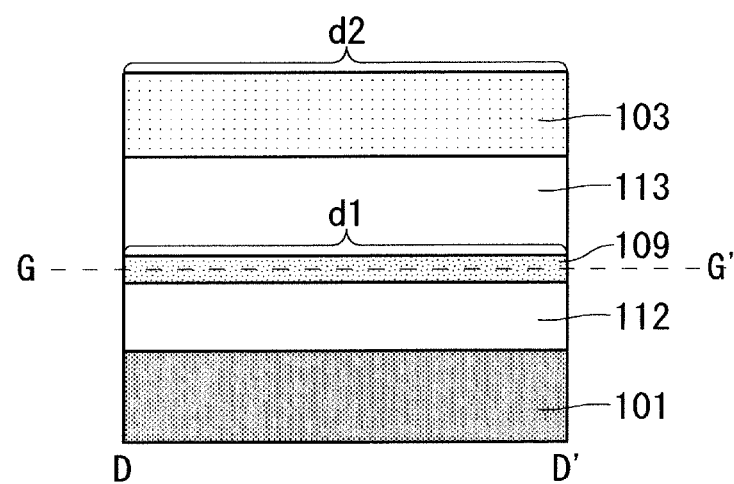
FIG. 30 is a cross-sectional view showing the configuration of the optical integrated element according to the third embodiment.

FIG. 29, FIG. 30, FIG. 31, and FIG. 32 are cross-sectional views of the configuration of the optical integrated element seen from a propagation direction of light, and are cross-sectional views taken along C-C', D-D', E-E', and F-F' of FIG. 27 and FIG. 28, respectively. The cross-sectional structure taken along C-C' of FIG. 29 corresponds to a structure of a deep ridge waveguide similarly to the cross-sectional structure taken along B-B' of FIG. 26. The cross-sectional structures of FIG. 30 to FIG. 32 are similar to the cross-sectional structures of FIG. 5 to FIG. 7, respectively.

Figure 36:
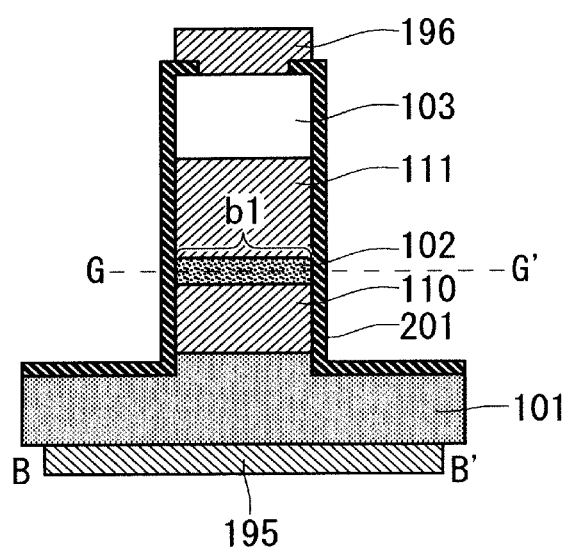
FIG. 36 is a cross-sectional view showing the configuration of the optical integrated element according to the third embodiment.

The structure of applying a voltage to the deep ridge waveguide is described. In the structure of the deep ridge waveguide of FIG. 26 etc. described in the above, electrodes 195 and 196 of FIG. 36 are respectively provided under the InP substrate 101 and on top of the fifth cladding layer 103. A voltage is applied to the two electrodes. As in FIG. 36, a surface of the deep ridge waveguide may be covered by an insulation film or a dielectric layer 201, and the insulation film or the dielectric layer 201 may be removed only from the top of the fifth cladding layer 103 to expose the fifth cladding layer 103 such that the electrode 196 may be provided on the exposed top of the fifth cladding layer 103.

Next, a method of manufacturing the optical integrated element according to the third embodiment as described above is described. First, the process of the manufacturing method described in the first embodiment from the layer stacking process of FIG. 9 to FIG. 15 prior to the electrode disposing process is performed. Subsequently, as in FIG. 33, a vertically stacked portion from the fifth cladding layer 103 to the InP substrate 101 is removed in a region where the current blocking layers 104 are present in top view. Then, the electrodes as described above in FIG. 36 and FIG. 37 are formed in each of the deep ridge waveguide and the ridge waveguide. The optical integrated element can be manufactured through the above process.

Also according to the semiconductor optical waveguide and the optical integrated element of the third embodiment as described above, the effects similar to those of the first embodiment and the second embodiment can be achieved. That is to say, not only the shape of the mode of light can be converted while loss of light is reduced, but a current can be efficiently injected into the first core layer 102 and the second core layer 109 as well.

Note that the change end positions of each width of the second core layer 109 and the fifth cladding layer 103 are located at the same position as the ridge width change start position in the third embodiment. However, this configuration is not restrictive, and these positions may differ as in the second embodiment, for example.

<Modification>

Figure 25:
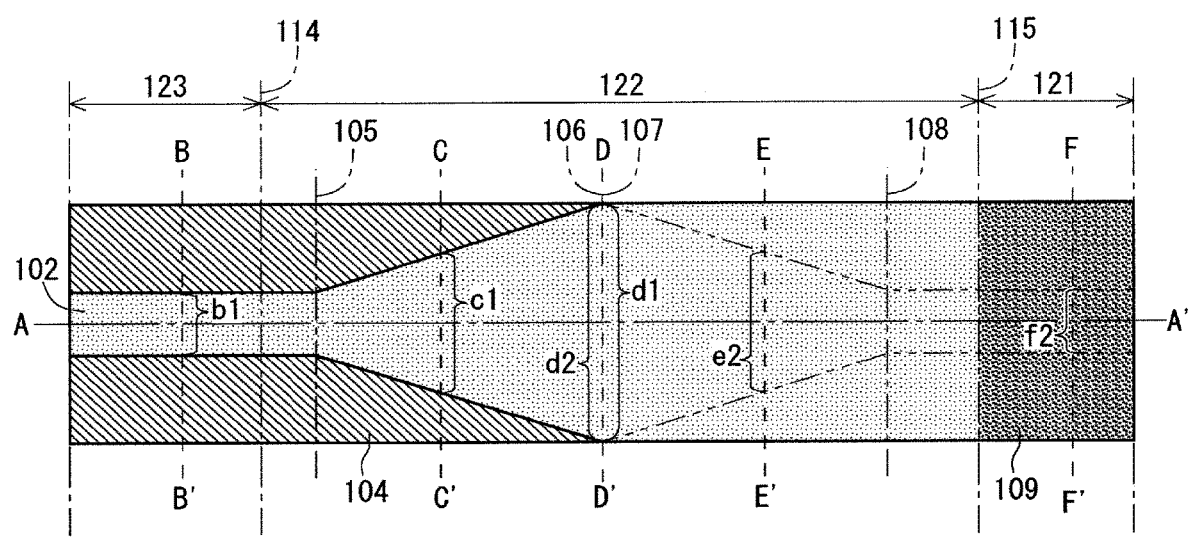
FIG. 25 is a cross-sectional view showing the configuration of an optical integrated element according to a modification.

In the first embodiment and the second embodiment, as shown in FIG. 2 and FIG. 17, a buried waveguide is used as the semiconductor laser 121, and a ridge waveguide is used as the modulator 123, but the present invention is not limited to this configuration. For example, as shown in FIG. 25, the modulator 123 may have a cross-sectional structure of a buried waveguide, and the semiconductor laser 121 may have a cross-sectional structure of a ridge waveguide, in which configuration the modulator 123 may be connected to a portion of the connecting waveguide 122 corresponding to one end side A, and the semiconductor laser 121 may be connected to a portion of the connecting waveguide 122 corresponding to another end side A'. In this case, not only light guided from the semiconductor laser 121 as a ridge waveguide can be guided to the modulator 123 as a buried waveguide while waveguide loss is reduced, but a current can be efficiently injected in to the core layer of the modulator 123 as well.

Alternatively, a structure adopting a semiconductor optical amplifier in place of the semiconductor laser 121 or the modulator 123 may be employed. This is because a semiconductor optical amplifier functions with voltage application similarly to the semiconductor laser 121 and the modulator 123.

Alternatively, a configuration in which the buried waveguide structure and the ridge waveguide structure are not active elements, i.e., either of the buried waveguide structure or the ridge waveguide structure is only a waveguide or both of these are only waveguides, may be employed. Even in this configuration, loss of light can be reduced in converting the mode of light in a direction from the buried waveguide structure toward the ridge waveguide structure, or in a reverse direction.

Figure 34:
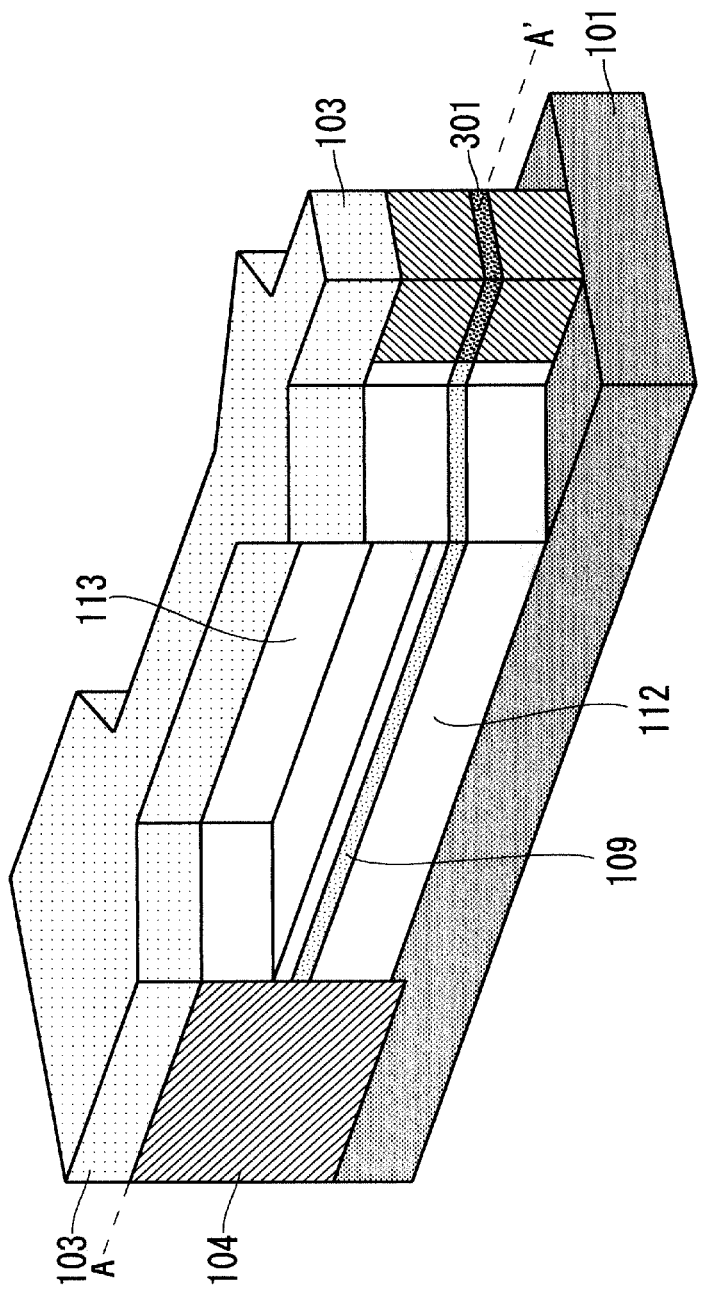
FIG. 34 is a perspective view showing the configuration of an optical integrated element according to a modification.

Alternatively, when the structure of the first embodiment or the second embodiment (the structure of the first semiconductor optical waveguide) and the structure of the third embodiment (the structure of the second semiconductor optical waveguide) are joined at a portion of a ridge waveguide, three structures of FIG. 34 that include a buried waveguide, a ridge waveguide, and a deep ridge waveguide can be obtained. According to such a configuration, the mode of light can be converted twice. Further, core layers that are independent of the three respective structures, namely, a first core layer 102, a second core layer 109, and a third core layer 301, may be formed, and the configuration of an active element or a waveguide may be employed for each of the three structures. Consequently, an optical integrated element having a maximum of three functional elements can be achieved.

Further, in the configuration described above, both sides of the second core layer 109 of the ridge waveguide in the width direction are not sandwiched by the current blocking layers 104. However, the configuration is not restrictive, and both sides of the second core layer 109 of the ridge waveguide in the width direction may be sandwiched by the current blocking layers 104 as appropriate. Further, in the configuration described above, a ridge portion is formed in the ridge waveguide. However, the configuration is not restrictive, and the ridge portion of the ridge waveguide may be buried in another component having a flat upper portion as appropriate.

Note that, in the present invention, each of the embodiments and modifications may be freely combined, and each of the embodiments and modifications may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

101 InP substrate, 103 fifth cladding layer, 104 current blocking layer, 109 second core layer, 112 third cladding layer, 113 fourth cladding layer, 121 semiconductor laser, 122 connecting waveguide, 123 modulator

The invention claimed is:

1. A semiconductor optical waveguide disposed on a substrate, comprising:
   a core layer having a refractive index higher than a refractive index of the substrate; and
   a cladding layer having a refractive index lower than the refractive index of the core layer, wherein
   on one end side of the substrate, a waveguide comprising the core layer and the cladding layer is disposed,
   on another end side of the substrate, a ridge waveguide comprising the core layer and the cladding layer is disposed, and both sides of the core layer in a layer-stacking direction are sandwiched by the cladding layer, and
   the waveguide and the ridge waveguide are coupled between the one end side and the another end side of the substrate,
   between the one end side and the another end side of the substrate, the core layer has a portion in which a width of the core layer becomes larger in a direction from the one end side toward the another end side, between the one end side and the another end side of the substrate, a projection of a ridge portion of the ridge waveguide has a portion in which a width of the projection of the ridge portion of the ridge waveguide becomes smaller in a direction from the one end side toward the another end side, and between a portion in which the width of the projection and the width of the core layer become equal and the another end side of the substrate, the width of the projection becomes smaller in a direction from the one end side toward the another end side, and thereby the width of the projection becomes smaller than the width of the core layer.

2. The semiconductor optical waveguide according to claim 1, further comprising:
a current blocking layer having electrical resistance higher than electrical resistance of the core layer, and having a refractive index lower than the refractive index of the core layer, wherein the waveguide is a buried waveguide further comprising the current blocking layer, on the one end side of the substrate, the buried waveguide is disposed, both the sides of the core layer in the layer-stacking direction are sandwiched by the cladding layer, and both sides of the core layer in a width direction that is perpendicular to the layer-stacking direction are sandwiched by the current blocking layer, on the another end side of the substrate, a cross-sectional shape of a part of the cladding layer sandwiching the core layer and located away from the substrate has a ridge shape, and between the one end side and the another end side of the substrate, the current blocking layer has a portion in which a width of the current blocking layer is changed in accordance with the change of the width of the core layer in a direction from the one end side toward the another end side.

3. The semiconductor optical waveguide according to claim 2, wherein
the core layer comprises InGaAsP or AlGaInAs.

4. The semiconductor optical waveguide according to claim 2, wherein
the current blocking layer comprises InP and any one of Zn, S, Fe, and Ru.

5. An optical integrated element comprising:
the semiconductor optical waveguide of claim 2;
a semiconductor laser disposed on the substrate and having a cross-sectional structure similar to a cross-sectional structure of the buried waveguide; and
a modulator disposed on the substrate and having a cross-sectional structure similar to a cross-sectional structure of the ridge waveguide, wherein
the semiconductor laser is connected to a portion of the semiconductor optical waveguide corresponding to the one end side, and
the modulator is connected to a portion of the semiconductor optical waveguide corresponding to the another end side.

6. An optical integrated element comprising:
the semiconductor optical waveguide of claim 2;
a modulator disposed on the substrate and having a cross-sectional structure similar to a cross-sectional structure of the buried waveguide; and a semiconductor laser disposed on the substrate and having a cross-sectional structure similar to a cross-sectional structure of the ridge waveguide, wherein
the modulator is connected to a portion of the semiconductor optical waveguide corresponding to the one end side, and
the semiconductor laser is connected to a portion of the semiconductor optical waveguide corresponding to the another end side.

7. An optical integrated element comprising:
the semiconductor optical waveguide of claim 2;
a semiconductor laser disposed on the substrate and having a cross-sectional structure similar to a cross-sectional structure of the buried waveguide; and
a semiconductor optical amplifier disposed on the substrate and having a cross-sectional structure similar to a cross-sectional structure of the ridge waveguide, wherein
the semiconductor laser is connected to a portion of the semiconductor optical waveguide corresponding to the one end side, and
the semiconductor optical amplifier is connected to a portion of the semiconductor optical waveguide corresponding to the another end side.

8. An optical integrated element comprising:
the semiconductor optical waveguide of claim 2;
a semiconductor optical amplifier disposed on the substrate and having a cross-sectional structure similar to a cross-sectional structure of the buried waveguide; and
a semiconductor laser disposed on the substrate and having a cross-sectional structure similar to a cross-sectional structure of the ridge waveguide, wherein
the semiconductor optical amplifier is connected to a portion of the semiconductor optical waveguide corresponding to the one end side, and
the semiconductor laser is connected to a portion of the semiconductor optical waveguide corresponding to the another end side.

9. An optical integrated element comprising:
the semiconductor optical waveguide of claim 2;
a semiconductor optical amplifier disposed on the substrate and having a cross-sectional structure similar to a cross-sectional structure of the buried waveguide; and
a modulator disposed on the substrate and having a cross-sectional structure similar to a cross-sectional structure of the ridge waveguide, wherein
the semiconductor optical amplifier is connected to a portion of the semiconductor optical waveguide corresponding to the one end side, and
the modulator is connected to a portion of the semiconductor optical waveguide corresponding to the another end side.

10. An optical integrated element comprising:
the semiconductor optical waveguide of claim 2;
a modulator disposed on the substrate and having a cross-sectional structure similar to a cross-sectional structure of the buried waveguide; and
a semiconductor optical amplifier disposed on the substrate and having a cross-sectional structure similar to a cross-sectional structure of the ridge waveguide, wherein
the modulator is connected to a portion of the semiconductor optical waveguide corresponding to the one end side, and
the semiconductor optical amplifier is connected to a portion of the semiconductor optical waveguide corresponding to the another end side.

11. The semiconductor optical waveguide according to claim 1, wherein
the waveguide is a deep ridge waveguide in which a width of the cladding layer and the width of the core layer are equal on the one end side of the substrate.

12. A semiconductor optical waveguide, comprising:
a first semiconductor optical waveguide being the semiconductor optical waveguide of claim 2; and
a second semiconductor optical waveguide, wherein
the second semiconductor optical waveguide is a deep ridge waveguide in which a width of the cladding layer and the width of the core layer are equal on the one end side of the substrate, and
the ridge waveguide of the first semiconductor optical waveguide and the deep ridge waveguide of the second semiconductor optical waveguide are coupled.

* * * * *